United States Patent [19]
Ishii

[11] Patent Number: 6,081,131
[45] Date of Patent: Jun. 27, 2000

[54] LOGICAL AMPLITUDE LEVEL CONVERSION CIRCUIT, LIQUID CRYSTAL DEVICE AND ELECTRONIC APPARATUS

[75] Inventor: Kenya Ishii, Nagano-ken, Japan

[73] Assignee: Seiko Epson Corporation, Tokyo, Japan

[21] Appl. No.: 09/020,912

[22] Filed: Feb. 9, 1998

[30] Foreign Application Priority Data

Nov. 12, 1997 [JP] Japan .................................. 9-310856

[51] Int. Cl.[7] ...................... H03K 19/0175; H03L 5/00; G09G 3/36; G09G 5/00
[52] U.S. Cl. ............................... 326/68; 326/68; 326/80; 326/81; 326/83; 327/333; 345/87; 345/92; 345/204
[58] Field of Search ................... 326/80, 68, 81, 326/83; 327/333; 345/87, 92, 204

[56] References Cited

U.S. PATENT DOCUMENTS

| 4,268,761 | 5/1981 | Suzuki et al. ......................... 307/264 |
|---|---|---|
| 5,646,642 | 7/1997 | Maekawa et al. . |
| 5,696,524 | 12/1997 | Hoshino et al. .......................... 349/89 |
| 5,712,586 | 1/1998 | Kitao ....................................... 327/333 |
| 5,719,648 | 2/1998 | Yoshii et al. ............................. 349/42 |
| 5,739,726 | 4/1998 | Ling .......................................... 331/57 |
| 5,748,024 | 5/1998 | Takahashi et al. ...................... 327/333 |

*Primary Examiner*—Michael Tokar
*Assistant Examiner*—Vibol Tan
*Attorney, Agent, or Firm*—Oliff & Berridge, PLC

[57] ABSTRACT

A logic amplitude level converter circuit of the present invention includes voltage biasing means for obtaining a signal being amplified swinging relative to the logic threshold voltage of an output-stage buffer circuit in response to the high-low level change of an input signal having a low logic amplitude, a pulse amplifier circuit for obtaining a high logic amplitude signal by pulse-amplifying the signal being amplified, and the output-stage buffer circuit for obtaining an inverted signal of the high logic amplitude signal in response to the high logic amplitude signal as an input.

23 Claims, 12 Drawing Sheets

LOGICAL AMPLITUDE LEVEL CONVERSION CIRCUIT, LIQUID CRYSTAL DEVICE AND ELECTRONIC APPARATUS

BACKGROUND OF THE INVENTION

1. Field of the Invention

The present invention relates to a logic amplitude level converter circuit which converts an input signal having a low (narrow) logic amplitude of 0–3 V to an output signal having a high (wide) logic amplitude of 0–12 V, and also relates to a liquid-crystal device incorporating the converter circuit on its substrate and an electronic apparatus employing the liquid-crystal device.

2. Description of Related Art

The liquid-crystal panel in an active-matrix type liquid-crystal device (thin-film transistor integrated circuit device) operates from a relatively high operating voltage, and its power supply voltage is about 12 V. An input clock signal of this liquid-crystal panel is supplied by an external timing generator (TG), and the timing generator is typically constructed of a CMOS gate array in which transistors are manufactured in a silicon chip, and its power supply voltage is relatively low, for example, 3V or in a range of 3.3 V–5 V. For this reason, the liquid-crystal panel is typically provided with a built-in logic amplitude level converter circuit which converts an input signal having a low (narrow) logic amplitude of 0–3 V to an output signal having a high (wide) logic amplitude of 0–12 V, and the converter circuit functions as a clock interface.

One of the logic amplitude level converter circuits built in such a liquid-crystal display device is disclosed in Japanese Unexamined Patent Publication No. 6-216753. The logic amplitude level converter circuit, as shown in FIG. 11, comprises detector/offset circuits 1A and 1B, which receive, as their inputs, two-phase clock signals CLK1 and CLK2 having opposite polarities and a low logic amplitude, a level shifter (level converter section) 2 of a differential current mirror circuit which obtains an output clock signal $V_{out}$ having a high logic amplitude by pulse-amplifying an offset signal, an output inverter 3 of an output-stage buffer circuit for buffering interactions from the subsequent stages, and a constant-current source 4.

Along with the constant-current source 4, P-channel transistors P2 and P6 of the detector/offset circuits 1A and 1B constitute a current mirror circuit, and to flow constant-currents $I_A$ and $I_B$ into N-channel type detection transistors N2 and N6 configured in a diode, the drain voltage of the detection transistors N2 and N6 configured in a diode is necessarily higher than the logic level voltage of the clock signals CLK1 and CLK2 as their source voltage, by an offset voltage (a voltage in excess of a threshold voltage $V_{th}$ of the detection transistors N2 and N6) $V_{offset}$ in accordance with constant currents $I_A$ and $I_B$. If the transistors are beforehand designed such that the threshold voltage $V_{th}$ of the detection transistors N2 and N6 is equal to the threshold voltage of N-channel input transistors N3 and N5 in the level shifter 2, the gate of the input transistor N3 at its gate will be supplied with the gate voltage (=2+$V_{offset}$, for example) which contains the high level of clock signal CLK1 plus the offset voltage even with the high level of the clock signal CLK1 (+2 V, for example) lower than the threshold voltage $V_{th}$. For this reason, the input transistor N3 reliably conducts, and since the gate of the input transistor N5 is supplied with the offset voltage only, the input transistor N5 becomes close to its cutoff state. A P-channel load transistor P5 conducts to drive its drain upward to a power supply voltage $V_{GG}$ (=+12 V).

Since the gate of the input transistor N3 is supplied with the offset voltage $V_{offset}$ only, with the clock signal CLK1 transited to its low level (0 V), the input transistor N3 comes close to its cutoff state while the input transistor N5 conducts, and the P-channel load transistor P5 cuts off to drive its drain downward to ground voltage $V_{SS}$ (=0 V).

The output inverter 3, constructed of CMOS inverter, outputs an inverted output clock signal $V_{out}*$ having a high logic amplitude in response to an output clock signal $V_{out}$ having a high logic amplitude.

The above conventional logic amplitude level converter circuit has the following disadvantages.

Since the detector transistor N2 has its gate S and drain D connected (in a diode configuration), it always operates in its saturation region, and its voltage-current characteristics are similar to the diode characteristics (a quadratic curve) as shown in FIG. 12. More particularly, supposing $I_D$ represents the drain current, $V_{DS}$ represents the source-drain voltage, and β represents the current amplification factor, the voltage-current characteristics are $$I_D = \beta(V_{DS} - V_{th})^2/2 \tag{1}$$

Supposing $R_{on}$ represents the ON-resistance (channel resistance) of the transistor P2 as a current source, the drain current $I_D$ is expressed by the following equation.

$$I_D = \beta(V_{GG} - V_{DS})/R_{on} \tag{2}$$

The offset voltage $V_{offset}$ corresponds to the intersection in FIG. 12 where the voltage-current characteristics expressed by equation (1) intersects the load line expressed by equation (2). As the ON-resistance $R_{on}$ of the current source transistor P2 increases, the inclination of the load line decreases, and the offset voltage $V_{offset}$ draws closer to a value in the vicinity of the threshold voltage $V_{th}$ from a value larger than the threshold voltage $V_{th}$, and since a high-resistance element is difficult to manufacture in a thin-film semiconductor circuit having a thin-film transistor (TFT) as a circuit element in view of utilization of space, high-resistance designs of the ON-resistance of the transistor P2 and variation-free resistance element are also difficult to implement. Since the ON-resistance $R_{on}$ is generally small, the offset voltage $V_{offset}$ is set to a value ($V_{th}$+v) exceeding the threshold voltage $V_{th}$.

When the input clock CLK1 is at a low level (0 V), the offset voltage $V_{offset}$ is approximately ($V_{th}$+v). The gate of the input transistor N3 is constantly supplied with the offset voltage $V_{offset}$ or greater, causing the level shifter 2 to strongly pulse-amplify the input clock CLK1 at its high-level polarity, in an unbalanced manner. Since the logic threshold value of the pulse-amplified output clock signal $V_{out}$ is substantially shifted to the low level side, it does not coincide with the logic threshold value of the output inverter 3. Therefore, the duty factor of the inverted output clock signal $V_{out}*$ output by the output inverter 3 is distorted from the duty factors of the input clocks CLK1 and CLK2.

SUMMARY OF THE INVENTION

In view of the above problem, the object of the present invention is to provide a logic amplitude level converter circuit which controls the distortion of the duty factor of a buffer output having a high logic amplitude against the duty factor of an input signal having a low logic amplitude, by making the logic threshold value of the high logic amplitude obtained through pulse amplification match the logic threshold value of an output-stage buffer circuit.

To resolve the above problem, the means of the present invention includes voltage biasing means which is placed before a pulse amplifier circuit to obtain a signal being amplified that swings relative to the logic threshold voltage of an output-stage buffer circuit in response to the high-low level change of an input signal having a low logic amplitude.

More particularly, the logic amplitude level converter circuit of the present invention, as shown in FIG. 1, comprises the voltage biasing means for obtaining a signal being amplified ($V_{in}$) that swings relative to the logic threshold voltage ($V_{thL}$) of the output-stage buffer circuit in response to the high-low level change of an input signal (CLK) having a low logic amplitude, a pulse amplifier circuit for obtaining a high logic amplitude signal ($V_{out}$) by pulse-amplifying the signal being amplified, and the output-stage buffer circuit for obtaining an inverted signal ($V_{out}^*$) in response to the high logic amplitude signal as an input.

When a low logic amplitude input signal becomes high level, the voltage biasing means outputs a voltage above the threshold voltage of the output-stage buffer circuit, and the pulse amplifier circuit pulse-amplifies this voltage to convert it into a high logic amplitude signal at a high level, and the output-stage buffer circuit outputs a high logic amplitude signal at a low level. Conversely, when the low logic amplitude input signal becomes low level, the voltage biasing means outputs a voltage below the threshold voltage of the output-stage buffer circuit, and the pulse amplifier circuit pulse-amplifies this voltage to convert it into a high logic amplitude signal at a low level, and the output-stage buffer circuit outputs the high logic amplitude signal at a high level.

Since the signal being amplified to the pulse amplifier circuit is preset to swing relative to the threshold voltage of the output-stage buffer circuit, the output signal of the pulse amplifier circuit swings relative to the logic threshold voltage of the output-stage buffer circuit. For this reason, the distortion of the duty factor of the high logic amplitude buffer output is controlled against the duty factor of the low logic amplitude input signal. Therefore, the logic amplitude level converter circuit of the present invention is suited for using for a clock interface.

Referring to FIG. 1, the voltage biasing means comprises a logic threshold value generator circuit for generating a logic threshold voltage of the output-stage buffer circuit, and a logic threshold value shift circuit for obtaining the signal being amplified that, with the generated logic threshold voltage as a DC bias, adjusts an offset voltage to the DC bias in response to the high-low level change of the low logic amplitude input signal.

In the conventional art shown in FIG. 11, an offset voltage is only added and output to the logic levels of the low logic amplitude in response to the high-low level change of the low logic amplitude input signal. However, the present invention adjusts the offset voltage (in addition and subtraction) to the level of the DC bias ($V_{thL}$) as an established reference, and the output signal (the signal being amplified) of the logic threshold value shift circuit is therefore interpreted as a logic threshold value shift signal in which the logic threshold value (approximately the center of the amplitude) of the low logic amplitude is shifted to a logic threshold value of the high logic amplitude.

The logic threshold value generator circuit, as shown in FIG. 1, is constructed by connecting, in a diode configuration, a dummy inverter of complementary transistors which are manufactured in a structure substantially identical to that of the output-stage buffer circuit.

Supposing $V_{thn}$ represents the threshold voltage of the N-channel MOS transistor (N1) in the complementary transistor dummy inverter, and $V_{thp}$ represents the threshold voltage of the P-channel MOS transistor as the P-channel MOS transistor (P1) in the complementary transistor dummy inverter, the drain current $I_{Dn}$ flowing through the N-channel MOS transistor (N1) is expressed by the following equation.

$$I_{Dn}=\beta_n(V_{DSn}-V_{thn})^2/2 \qquad (3)$$

where $V_{DSn}$ represents the source-drain voltage of the N-channel MOS transistor (N1) and $\beta_n$ represents its current amplification factor. The drain current $I_{Dp}$ of the P-channel MOS transistor (P1) is expressed by the following equation.

$$I_{Dp}=\beta_p(V_{DSp}+V_{thp})^2/2 \qquad (4)$$

where $V_{DSp}$ represents the source-drain voltage of the P-channel MOS transistor (P1) and $\beta_p$ represents its current amplification factor.

Supposing $I_{Dn}=I_{Dp}$, power supply voltages $V_{SS}=0$, and if $V_{GG}$ is established, $V_{DSp}=V_{GG}-V_{DSn}$, the logic threshold voltage $V_{thL}$ of the dummy inverter corresponds to the intersection in FIG. 2 by these relationships and equations (3) and (4).

The logic threshold value shift circuit, as shown in FIG. 1, comprises a mirror current transistor (P2) which, along with the logic threshold value generator circuit, constitutes a current mirror circuit, a diode-configured offset voltage generator transistor (N2), connected in series with the mirror current transistor (P2), with its source as an input terminal ($P_1$) for the input clock signal CLK having low logic amplitude and with its drain as an output terminal ($P_2$), and DC bias setting means r connected in parallel with the offset voltage generator transistor (N2).

Available as the DC bias setting means is a resistance element r shown in FIG. 1, or the ON-resistance of a transistor.

With the threshold voltage at $V_{thL}$, a through current $I_0$ flows through the dummy inverter as a source current, but if elements are manufactured in a substantially identical structure, a mirror current $I_0$ flows through the mirror current transistor (P2) at a mirror coefficient of 1. If the resistance value r of the DC bias setting means is preset to $V_{thL}/I_0$, the logic threshold voltage $V_{thL}$ reappears at the output terminal ($P_2$) as a DC bias in case that the offset voltage generator transistor (N2) is fully cut off.

Since the transistor (N2) is connected in a diode configuration in practice, it operates in a saturation state, and a slight current flows therethrough. Suppose $I_{LOW}$ represents a current flowing through the transistor (N2) when the input signal CLK is at a low level (0 V), the current flowing through the DC bias setting means is reduced accordingly, and the voltage $V_{in}$ at the output terminal ($P_2$) becomes ($V_{thL}-I_{LOW} \cdot r$) which is lower than $V_{thL}$. This is equal to the source-drain voltage of the transistor (N2). In summary, when the input signal CLK is at a low level (0 V), the offset voltage ($I_{LOW} \cdot r$) is subtracted from the DC bias $V_{thL}$.

Suppose $I_{HIGH}$ represents the current which flows through the transistor (N2) when the input signal CLK is at a high level (for example, a low logic amplitude value A=2V), the current flowing through the DC bias setting means is reduced accordingly. However, since the input terminal ($P_1$) is raised to a high level, the voltage $V_{in}$ at the output terminal ($P_2$) becomes ($V_{thL}-I_{HIGH} \cdot r+2$) which is higher than $V_{thL}$. In summary, when the input signal CLK is at a high level (0 V), the offset voltage ($-I_{LOW} \cdot r+2$) is added to the DC bias $V_{thL}$. It is noted that the value of the $I_{HIGH} \cdot r$ is smaller than the low logic amplitude value of 2 V. Since the current flowing through the transistor (N2) is smaller when the input signal CLK is at a high level than when the input signal CLK is at a low level, conditions ($I_{HIGH} < I_{LOW}$), $I_{HIGH} \cdot r < 2$ are easy to satisfy. A low-resistance element is advantageously easy to manufacture in the semiconductor process.

Referring to the conventional circuit shown in FIG. 11, when the input clock CLK1 falls to a low level (0 V), the drain current $I_D$ slightly increases in practice, the offset voltage $V_{offset}$ slightly increases to ($V_{th} + v + \Delta v$) which is higher than that at a high level, and it is hard for the gate voltage of the input transistor N3 to fall from its high level state. Since the transistor (N2) and the DC bias setting means r are connected in parallel to form a shunt circuit in the present invention, it is easy to obtain the above condition of $I_{HIGH} \cdot r < 2$, that is, it is easy to make the voltage drop ($I_{HIGH} \cdot r$) of the DC bias setting means smaller than the low logic amplitude value A (2 V).

According to the present invention, voltage holding means is provided to hold the logic threshold voltage $V_{thL}$ as shown in FIG. 1. When a high-speed signal is amplitude-level converted in the logic amplitude level converter circuit, noise tends to be generated at each high-low level change of the high logic amplitude subsequent to the pulse amplification. The noise may be fed back to the output wiring layer of the logic threshold value generator circuit, possibly causing a voltage fluctuation, but the logic threshold voltage generated by the voltage holding means is held, reducing the effect of the noise and controlling the fluctuations of the logic threshold voltage.

Available as the voltage holding means is a capacitor (C) formed between the output wiring layer of the logic threshold value generator circuit and a power supply wiring layer. The capacitor can be an interlayer capacitor that includes a region constructed of a wide wiring line of the output wiring layer and the power supply wiring layer running in parallel with an interlayer insulating film in between. Such structure is particularly advantageous in a manufacturing process, because it can be constructed by only routing of the wiring layers and changing the shape.

A pulse amplifier circuit used in the logic amplitude level converter circuit is a current-mirror type pulse amplifier circuit including an input transistor for variably controlling the current flowing through a current-source transistor and a load transistor for variably controlling the mirror current flowing through a mirror current transistor. The output terminal is connected to the gate of the input transistor while the input terminal is connected to the source of the load transistor. In such a case, a load value variable control circuit is provided in which the voltage at the output terminal is inverted in level, and the inverted signal is fed to the gate of the load transistor as a control signal.

Since the voltage at the output terminal reaches a level above the logic threshold voltage, as described before, when the low logic amplitude input signal becomes high level, the mirror current increases as the source current of the current mirror circuit increases. Since the load transistor becomes a high load by the load value variable control circuit, the voltage drop increases, causing the output of the pulse amplifier circuit to be a high level of the high logic amplitude. Conversely, when the low logic amplitude input signal becomes low level, the voltage at the output terminal reaches a level below the logic threshold voltage, as described before, and the source current of the current mirror circuit decreases, causing the mirror current to decrease. Since the load transistor becomes a low load by the load value variable control circuit, the voltage drop decreases, causing the output of the pulse amplifier circuit to be a low level of the high logic amplitude.

In the pulse amplifier circuit of the current mirror circuit type for achieving a high-speed rise and a high-speed fall, the high level of the output does not pull up fully to the power supply voltage ($V_{GG}$) and also the low level of the output does not pull down fully to the power supply voltage ($V_{SS}$). Since the logic threshold voltage of the pulse amplified signal fully coincides with that of the output-stage buffer circuit, the deviation (voltage drop) between the logic level and the power supply voltage is naturally canceled by swinging it fully to the range of the power supply voltage in the output-stage buffer circuit. This pulse amplifier circuit can level-shift by a single phase input of the low logic amplitude, and is suited to level shifting of a high-speed signal such as a clock signal. The output-stage buffer circuit can be made of not only a one-stage inverter, but also more than two stages of inverters.

The mentioned load value variable control circuit comprises a mirror current transistor which, along with the logic threshold value generator circuit, constitutes the current mirror circuit, and a drive transistor connected in series with the mirror current transistor, with the voltage at the output terminal as the gate voltage and with the drain voltage as the control signal.

Another pulse amplifier circuit is a current-mirror type pulse amplifier circuit including an input transistor for controlling variably the current flowing through a current-source transistor and a load transistor for variably controlling the mirror current flowing through a mirror current transistor. When the output terminal is connected to the gate of the input transistor, an input signal of low logic amplitude with opposite phase to the first input signal is coupled to the source of the input transistor. In such a case, a load value variable control circuit is provided in which the voltage of the opposite phase input signal is offset and be applied to the gate of the load transistor as a control signal. The load value variable control circuit is a pulse amplifier circuit of two-phase input, differential current mirror circuit type, and suited for the level shifting of a high-speed signal.

Furthermore, another pulse amplifier circuit is a flip-flop type pulse amplifier circuit including a first transistor for controlling one transistor of a flip-flop to turn on and off, and a second transistor for controlling the other transistor of the flip-flop to turn on and off, and the output terminal is connected to the gate of the first transistor.

In such a case, a load value variable control circuit is provided in which the voltage of the opposite phase input signal is offset and is applied to the gate of the second transistor as a control signal. The load value variable control circuit is a pulse amplifier circuit of two-phase input, flip-flop circuit type, and is suited for reducing power consumption.

The logic threshold shift value circuit comprises a mirror current transistor which, along with the logic threshold value generator circuit, constitutes current mirror circuit, a diode-configured offset voltage generator transistor, connected in series with the mirror current transistor, with its source as an input terminal for the opposite phase input signal and with its drain as an output terminal for the control signal, and a DC bias setting transistor connected in parallel with the offset voltage generator transistor.

The logic amplitude level converter circuit described above is suited for a clock interface. For example, a liquid-crystal device of the present invention comprises a pair of substrates between which is interposed a liquid crystal, a pixel assembly arranged in a matrix of transistors and pixel electrodes respectively connected to the transistors on one of the substrates, a drive circuit for controlling the supply of a signal to the pixel assembly, and a clock interface for supplying the drive circuit with a clock signal, wherein the clock interface comprises the logic amplitude level converter circuit. Such a liquid-crystal device controls the distortion of a high-speed clock, presenting an improved image quality. The present invention includes an electronic apparatus incorporating such a liquid-crystal device.

The feature of the present invention is also described as follows.

The logic amplitude level converter circuit comprises a voltage level converter for converting an input signal having a relatively low logic amplitude into an output signal having a relatively high logic amplitude and an inverter circuit for inverting the output signal from the voltage level converter, wherein the voltage level converter comprises a logic threshold value shift circuit which receives the input signal and generates a signal being converted for making the input signal to swing respect to the logic threshold voltage of the inverter circuit, and a amplifier circuit for amplifying the signal being converted. The logic amplitude level converter circuit further comprises a logic threshold value generator circuit for generating the logic threshold voltage of the inverter circuit, wherein a circuit current value is controlled according to the logic threshold voltage in the logic threshold value shift circuit.

Furthermore, the logic amplitude level converter circuit comprises a voltage level converter for converting an input signal having a relatively low logic amplitude into an output signal having a relatively high logic amplitude and an inverter circuit for inverting the output signal from the voltage level converter, wherein the voltage level converter comprises an input terminal for the input signal, a first transistor which its gate inputs the logic threshold voltage of the inverter circuit, second and third transistors which are electrically connected in series between the input terminal and the first transistor, an electrical node of the first transistor and the second transistor, and an amplifier for converting the output from the electrical node into an output signal having the relatively high logic amplitude, wherein the second transistor receives the logic threshold voltage and the gate of the third transistor is connected to the electrical node. A capacitor formed relative to the potential of a power supply is attached to the gates of the first and second transistors.

DETAILED DESCRIPTION OF THE PREFERRED EMBODIMENTS

Figure 1:
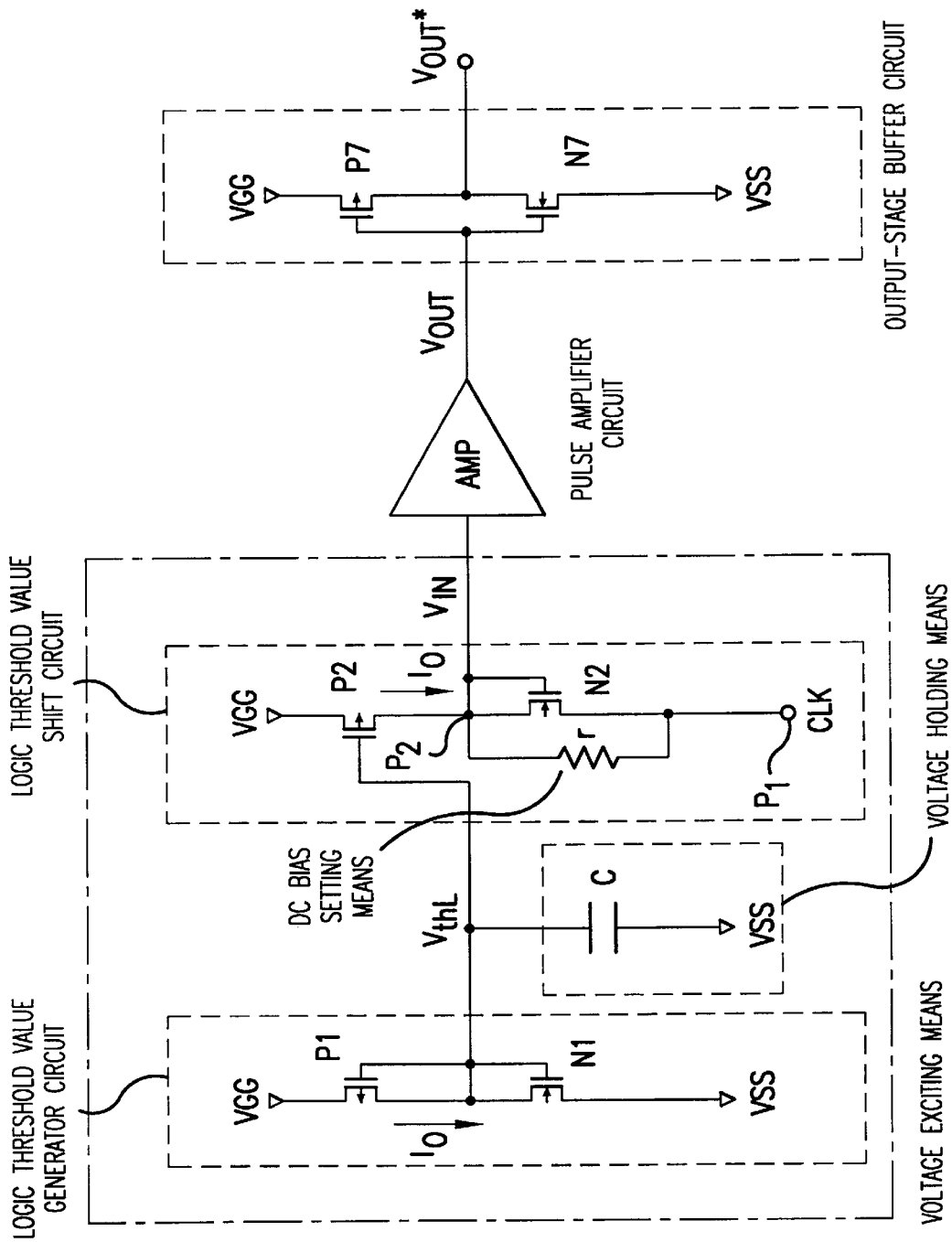
FIG. 1 is a schematic diagram showing the basic construction of a logic amplitude level converter circuit of the present invention.
Figure 2:
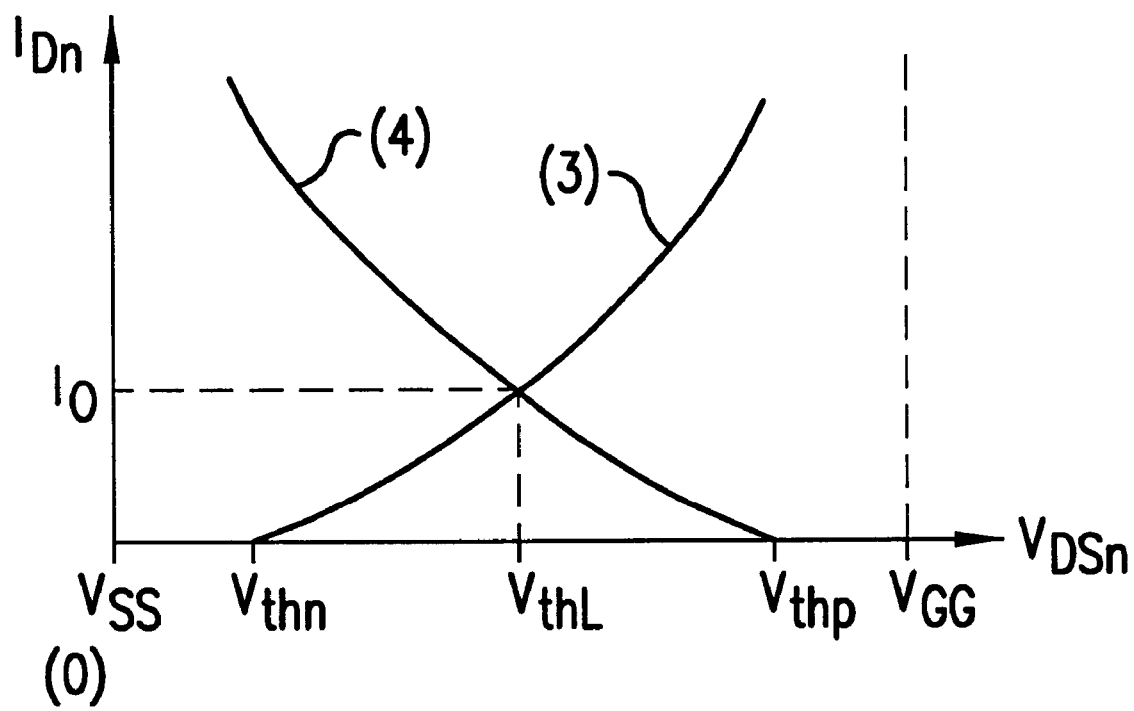
FIG. 2 is a graph showing voltage-current characteristics for understanding the voltage generation operation with a logic threshold value at the logic threshold value generator circuit in the logic amplitude level converter circuit.

Referring to the drawings, the embodiments of the present invention are discussed further in detail.
(First embodiment)

Figure 3:
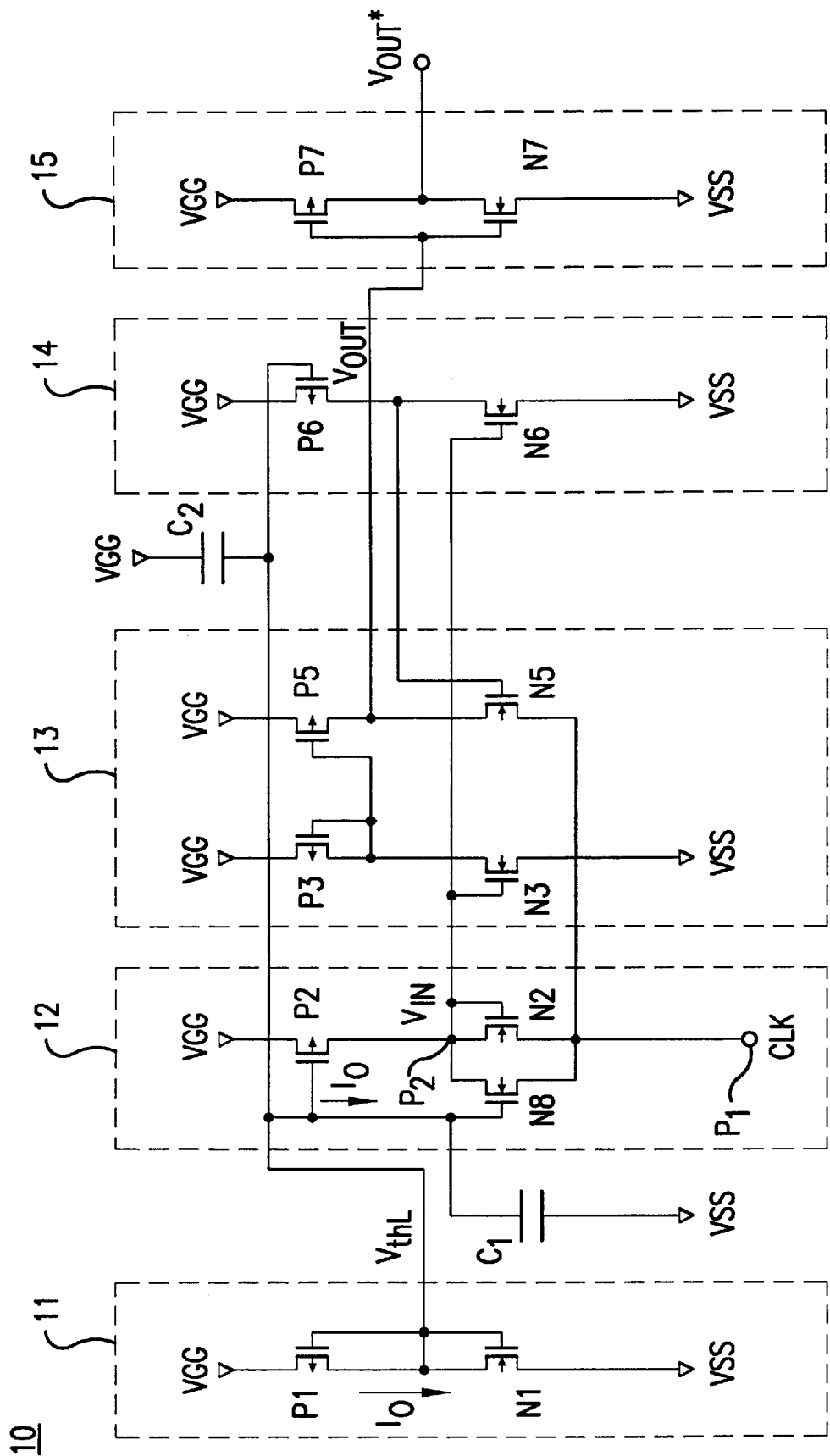
FIG. 3 is a schematic diagram showing the first embodiment of the logic amplitude level converter circuit in the present invention.
Figure 4A:
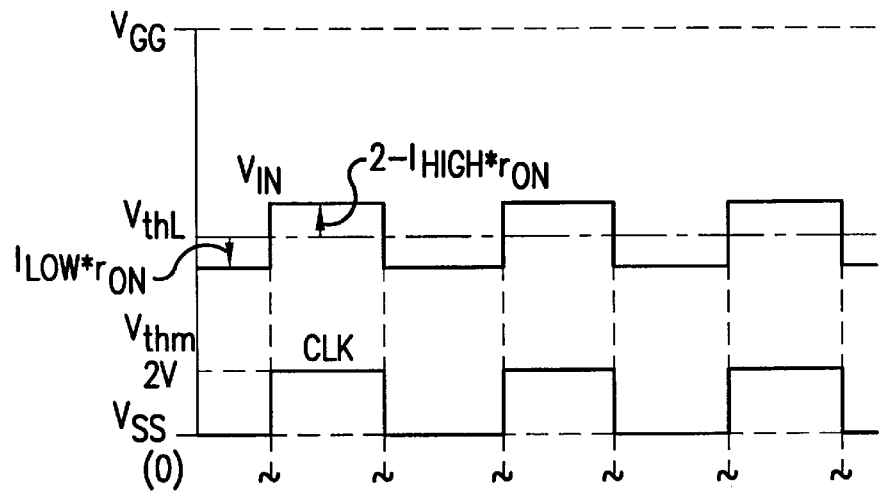
FIGS. 4(A)–4(C) are waveform diagrams illustrating the operation of the first embodiment.
Figure 4B:
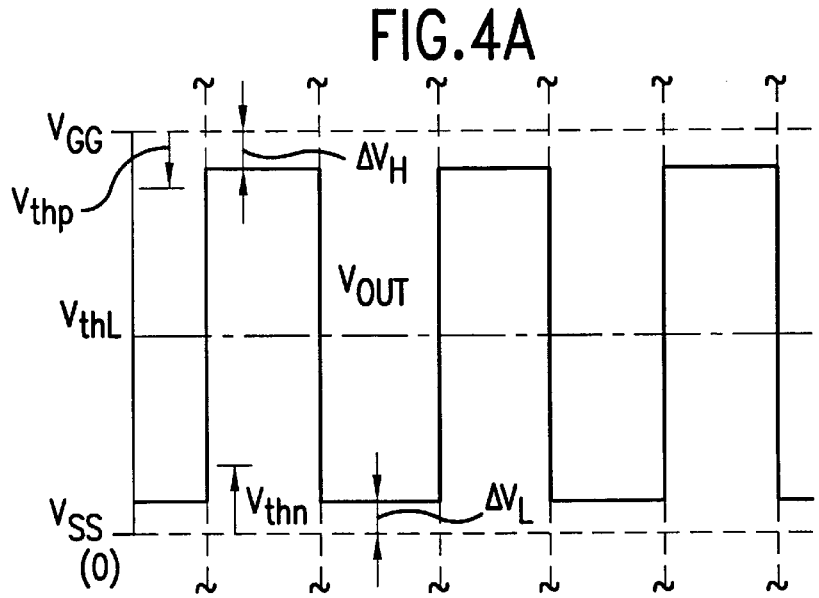
Figure 4C:
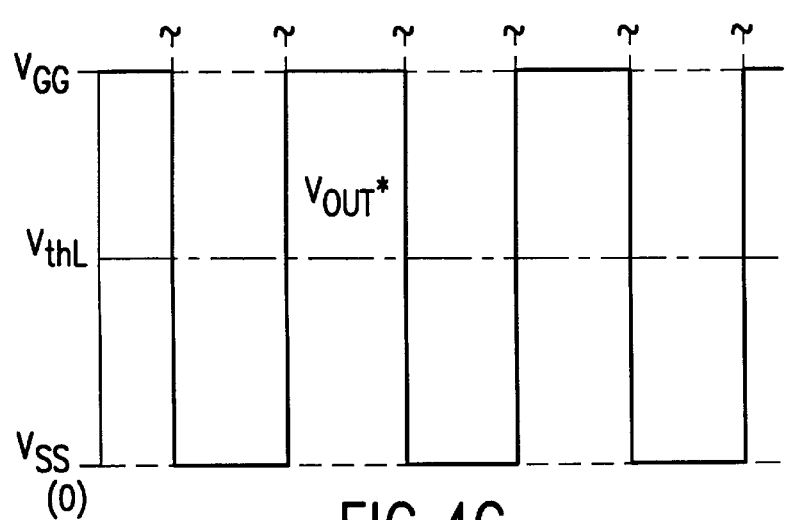

FIG. 3 is a schematic diagram showing a first embodiment of the logic amplitude level converter circuit of the present invention. FIGS. 4(A)–4(C) are waveform diagrams illustrating the operation of the first embodiment.

A logic amplitude level converter circuit 10 of this embodiment comprises a logic threshold value generator circuit 11 for generating a logic threshold voltage $V_{thL}$ of an output CMOS inverter 15 of an output buffer circuit, a logic threshold value shift circuit 12 which, using the generated logic threshold voltage $V_{thL}$ as a DC bias, generates a signal being amplified $V_{in}$ by adjusting an offset voltage $V_{offset}$ to the DC bias in response to the high-low level change of a clock input signal CLK having a low logic amplitude, a pulse amplifier circuit 13 for obtaining a high logic amplitude signal $V_{out}$ by pulse-amplifying the signal being amplified $V_{in}$, a load value variable control circuit 14 for supplying a control signal to the gate of a load transistor N5 in the pulse amplifier circuit 13 in response to the high-low level change of the clock input signal, and a CMOS inverter 15 of an output-stage inverter circuit for outputting an inverted signal $V_{out}*$ in response to the high logic amplitude signal $V_{out}$ as an input. The logic threshold value generator circuit 11 and logic threshold value shift circuit 12 correspond to the voltage biasing means for obtaining the signal being amplified which swings with respect to the reference of the logic threshold voltage $V_{thL}$ in response to the high-low level change having the input signal CLK of the low logic amplitude.

The logic threshold value generator circuit 11 of this embodiment is produced by connecting in a diode configuration a CMOS dummy inverter which is manufactured in a structure to be substantially identical to that of an output CMOS inverter 15. As described, the logic threshold voltage $V_{thL}$ of the CMOS inverter 15 is constantly generated at the common drain of a P-channel transistor P1 and an N-channel transistor N1. Connected to the common drain (output wiring) of the dummy inverter are capacitors $C_1$ and $C_2$ as voltage holding means for holding the logic threshold voltage $V_{thL}$.

The logic threshold value shift circuit 12 of this embodiment comprises a mirror current transistor P2 which, along with the logic threshold value generator circuit 11, constitutes a current mirror circuit, a diode-configured offset voltage generator transistor N2 which is connected in series with the mirror current transistor P2, with its source as an input terminal $P_1$ for the input clock signal CLK having low logic amplitude and with its drain as an output terminal $P_2$, and a MOS transistor N8 as DC bias setting means connected in parallel with the offset voltage generator transistor N2.

The pulse amplifier circuit 13 of this embodiment is a current-mirror type pulse amplifier circuit which includes an input transistor N3 for controlling variably the current flowing through a current-source transistor P3 and a load transistor N5 for controlling variably the mirror current flowing through a mirror current transistor P5. The output terminal $P_2$ is connected to the gate of the input transistor N3, while the input terminal $P_1$ is connected to the source of the load transistor N5. A load value variable control circuit 14 inverts the voltage $V_{in}$ at the output terminal $P_2$ in level, and the inverted signal is fed to the gate of the load transistor N5 as a control signal. The load value variable control circuit 14 comprises a mirror current transistor P6 which, along with the logic threshold value generator circuit 11, constitutes the current mirror circuit, and a drive transistor N6 connected in series with the mirror current transistor P6, with the voltage $V_{in}$ at the output terminal $P_2$ used as the gate voltage and with the drain voltage used as the control signal.

The output CMOS inverter 15 is constructed of a P-channel transistor P7 and an N-channel transistor N7.

A through current $I_0$ flows through the logic threshold value generator circuit 11 as a source current, and a mirror current $I_0$ also flows through the mirror current transistor P2 in the logic threshold value shift circuit 12 because elements of the transistors are manufactured to be substantially identical structure. Since the gate of a transistor N8 as the DC bias setting means is supplied with the logic threshold voltage $V_{thL}$, the ON-resistance $r_{on}$ of the transistor N8 is $V_{thL}/I_0$. The logic threshold voltage $V_{thL}$ reappears at the output terminal $P_2$ as a DC bias if the offset voltage generator transistor (N2) is fully cut off.

Since the transistor N2 is connected in a diode configuration, the transistor N2 operates in a saturated state, causing a slight current to flow therethrough. Suppose $I_{LOW}$ represents the current flowing through the transistor (N2) with the clock input signal CLK at a low level (0 V), the current flowing through the transistor N8 is reduced accordingly. As shown in FIG. 4(A), the voltage $V_{in}$ at the output terminal $P_2$ is $(V_{thL}-I_{LOW} \cdot r_{on})$, which is lower than $V_{thL}$, namely lower than $V_{thL}$ by the offset voltage $V_{offset} = I_{LOW} \cdot r_{on}$. The voltage $V_{in}$ is equal to the source-drain voltage of the transistor (N2).

Suppose $I_{HIGH}$ represents the current flowing through the transistor (N2) with the clock input signal CLK at a high level (2 V, for example), the current flowing through the transistor N8 is reduced accordingly, while the input terminal $P_1$ is raised to a high level. Therefore, as shown in FIG. 4(A), the voltage $V_{in}$ at the output terminal $P_2$ is driven to $(V_{thL}-I_{HIGH} \cdot r_{on}+2)$ which is higher than $V_{thL}$. The value of $I_{HIGH} \cdot r$ is smaller than the low logic amplitude of 2V. Since the current flowing through the transistor (N2) is smaller with the input signal CLK at a high level than with the input signal CLK at a low level, conditions ($I_{HIGH} < I_{LOW}$), $I_{HIGH} \cdot r_{on} < 2$ are easy to satisfy. A low-resistance element is advantageously easy to implement at the semiconductor process.

Since the voltage $V_{in}$ at the output terminal $P_2$ reaches a level above the logic threshold voltage $V_{thL}$ when the low logic amplitude input signal CLK becomes high level, the source current flowing through the input transistor N3 of the pulse amplifier circuit increases, and the mirror current flowing through the mirror current transistor P5 also increases. Since the drain voltage of the drive transistor N6 in the load value variable control circuit 14 drops, the load transistor N5 becomes a high load, its drain voltage increases, and thereby the output of the pulse amplifier circuit 13 becomes high level of high logic amplitude as shown in FIG. 4(B).

Conversely, when the low logic amplitude input signal CLK becomes low level, the voltage $V_{in}$ at the output terminal $P_2$ becomes a level below the logic threshold voltage $V_{thL}$. Therefore, as the source current flowing through the input transistor N3 in the pulse amplifier circuit decreases, the mirror current flowing through the mirror current transistor P5 also decreases. Since the drain voltage of the drive transistor N6 in the load value variable control circuit 14 rises, the load transistor becomes a low load, its drain voltage decreases and thereby the output of the pulse amplifier circuit 13 becomes low level of high logic amplitude as shown in FIG. 4(B).

Since the signal being amplified $V_{in}$, supplied to the pulse amplifier circuit 13, already swings relative to the logic threshold voltage $V_{thL}$ of the CMOS inverter 15 as a reference, the output signal $V_{out}$ of the pulse amplifier circuit 13 swings relative to the logic threshold voltage of the CMOS inverter 15 as a reference. For this reason, the distortion of the duty factor of the high logic amplitude inverter output $V_{out}*$ is controlled against the duty factor of the low logic amplitude input signal CLK.

The high level of the output of the pulse amplifier circuit 13 is not fully pulled up to the power supply voltage ($V_{GG}$) and also the low level of the output of the pulse amplifier circuit 13 is not fully pulled down to the power supply voltage ($V_{SS}$). This is because a through current needs to flow constantly in the pulse amplifier circuit 13 of the current mirror circuit type for achieving a high-speed rise and a high-speed fall (fast response characteristics). Since the logic threshold voltage coincides with the logic threshold voltage $V_{thL}$ of the output inverter 15 as shown in FIG. 4(C), the deviation between the logic level and the power supply voltage (voltage drop) $\Delta V_H$, $\Delta V_L$ is naturally canceled by permitting to swing fully to the range of the power supply voltage in the CMOS inverter 15 in the output-stage buffer circuit. In such a case, it is required that the voltage drop $\Delta V_H$ on the high level side be lower than the threshold voltage $V_{thp}$ of the P-channel MOS transistor P7, and that the voltage drop $\Delta V_L$ be lower than the threshold voltage $V_{thn}$ of the N-channel MOS transistor.

The sizes of the transistors are preferably adjusted (it is acceptable if the ratios of current amplification factors ($\beta_p:\beta_n$) are identical between pairs of transistors even though the sizes of both P-channel transistors or both N-channel transistors are not the same) so that the logic threshold voltages of the CMOS circuits (P3 and N3), (P5 and N5), and (P6 and N6) in the pulse amplifier circuit 13 coincide with the logic threshold voltage $V_{thL}$ of the inverter 15 in the output-stage buffer circuit. In this way, the output signal $V_{out}$ easily swings relative to the logic threshold voltage $V_{thL}$.

Such a pulse amplifier circuit 13 can level-shift a single phase input of the low logic amplitude, and is suited to level shifting of a high-speed signal.

Figure 5:
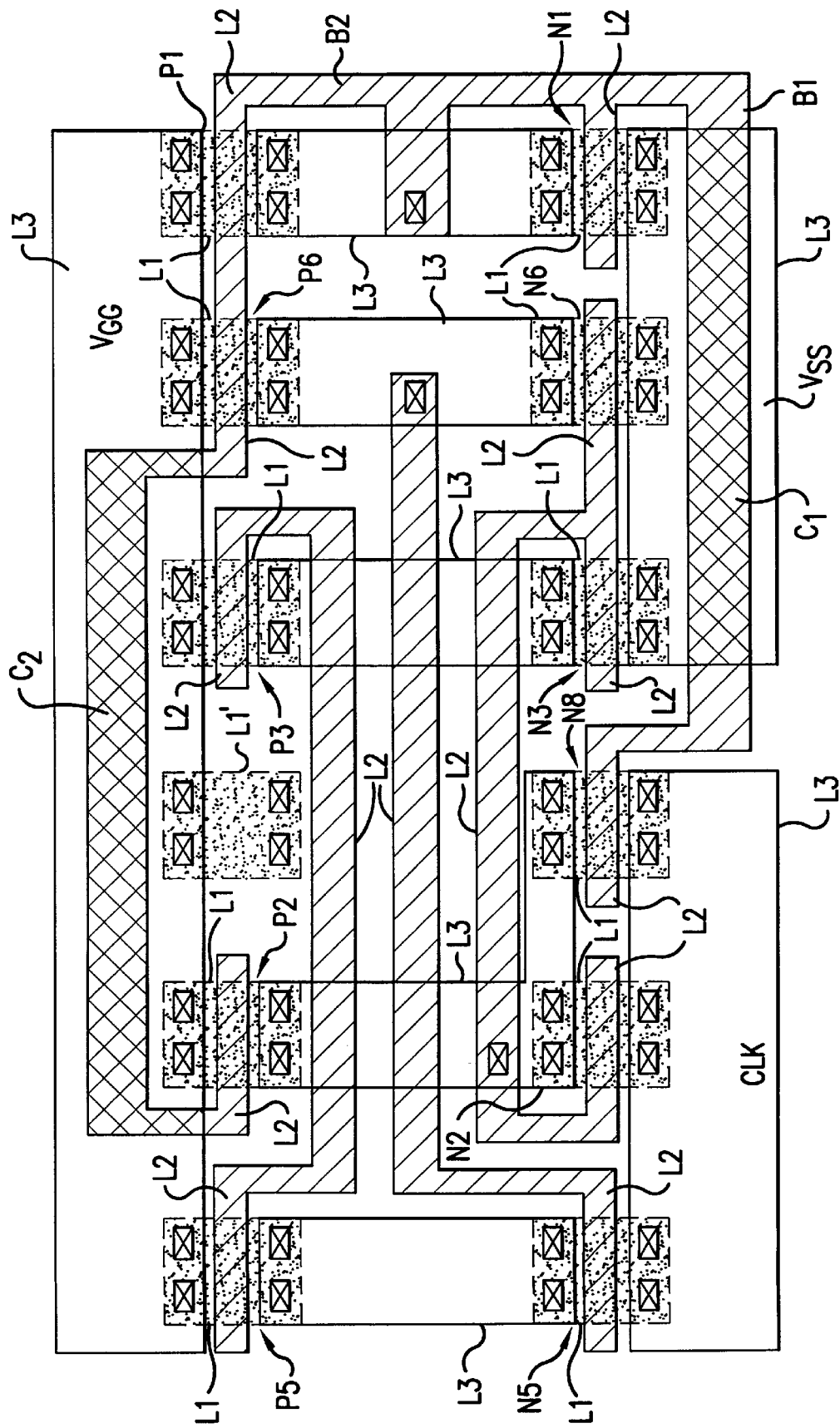
FIG. 5 shows a plane pattern of the first embodiment which incorporates thin-film transistors (TFTs).

FIG. 5 shows a plane pattern of the logic amplitude level converter circuit 10 which incorporates thin-film transistors (TFTs). P-channel TFTs (P1, P6, P3, P2, and P5) and N-channel TFTs (N1, N6, N3, N8, N2 and N5) are arranged in two parallel columns, respectively. These TFTs have polycrystalline layers of L1 and L1' (rectangular shaded areas), as the first layer, forming channel regions on an insulating substrate, and polycrystalline layers L2, as the second layer, forming gate electrodes with the center portions of the first polycrystalline layers of L1 and L1' piled with a gate insulating film interposed therebetween, and impurities are doped in a self-aligning fashion with the gate electrodes as a mask. Aluminum layers L3, as the third layer, are formed on the second polycrystalline layers L2 with an insulating layer interposed therebetween.

A wide power supply wiring layer $V_{GG}$ of the aluminum layer L3 is extended along the one side of two TFT columns and is connected to the sources of TFTs (P1, P6, P3, P2 and P5) via contact holes. A power supply wiring layer $V_{SS}$ and a wiring layer CLK for the low logic amplitude input signal are extended along the other side of the two TFT columns, and the power supply wiring layer $V_{SS}$ is connected to the sources of TFTs (N1, N6, and N3) via contact holes, and the input signal wiring layer CLK is connected to the sources of TFTs (N8, N2, and N5) via contact holes. The common drains for the TFT (P1 and N1), the common drains for the TFT (P6 and N6), the common drains for the TFT (P3 and N3), the common drains for the TFT (P2 and N2), and the common drains for the TFT (P5 and N5) are respectively connected via the aluminum layers L3 and contact holes.

The common drains of the TFT (P1 and N1) constituting the logic threshold value generator circuit 11 are connected via the aluminum layer L3, and branch wiring lines B1 and B2 are branched off from the second polycrystalline layer L2 connected to the aluminum layer L3. One branch line B1 has a wide portion that is extended in an overlap area with the wide power supply wiring layer $V_{SS}$, forming an interlayer capacitor $C_1$. The other branch line B2 has a wide portion that is extended in an overlap area with the power supply wiring layer $V_{GG}$, forming an interlayer capacitor $C_2$.

The current mirror type pulse amplifier is constructed of the CMOS circuit (P3 and N3) at the current source side and the CMOS circuit (P5 and N5) at the mirror current side. In the layout in this embodiment, both CMOS circuits are not adjacent to each other, and the DC bias setting TFT (N8), mirror current TFT (P2) and offset voltage generator TFT (N2) constituting the logic threshold value shift circuit 12 are interposed between both CMOS circuits. In such a layout, the overlap length between the branch line B1 and the power supply wiring layer $V_{SS}$ and the overlap length between the branch line B2 and the power supply wiring layer $V_{GG}$ are necessarily extended to assure sufficient capacitance of the capacitors $C_1$ and $C_2$.

When the high-speed logic amplitude level is converted, noise tends to be generated at each high-low level change of the high logic amplitude subsequent to the pulse amplification, and the noise may be fed back to the output wiring layer (B1 and B2) of the logic threshold value generator circuit 11, possibly causing a voltage fluctuation. However, having capacitors $C_1$ and $C_2$ with sufficient capacitance would hold the generated logic threshold voltage $V_{thL}$, reducing the effect of the noise and controlling the fluctuations of the logic threshold voltage. The capacitors $C_1$ and $C_2$ in this embodiment are constructed by simply arranging the layout of the TFT and modifying the shape and routing of the wiring layer, with not extra process steps involved, and are advantageous in the manufacturing process.

Each N-channel TFT transistor is preferably manufactured at the same process and at the same transistor size (channel width $W_N$/channel length $L_N$), and each P-channel TFT transistor is also preferably manufactured at the same process and at the same transistor size (channel width $W_P$/channel length $L_P$). The polycrystalline layer L1' as the first layer is a dummy region which is formed between the transistors P2 and P3 to provide transistors P2 and P3 with the surrounding structure equivalent to the transistor P8.

(Second embodiment)

Figure 6:
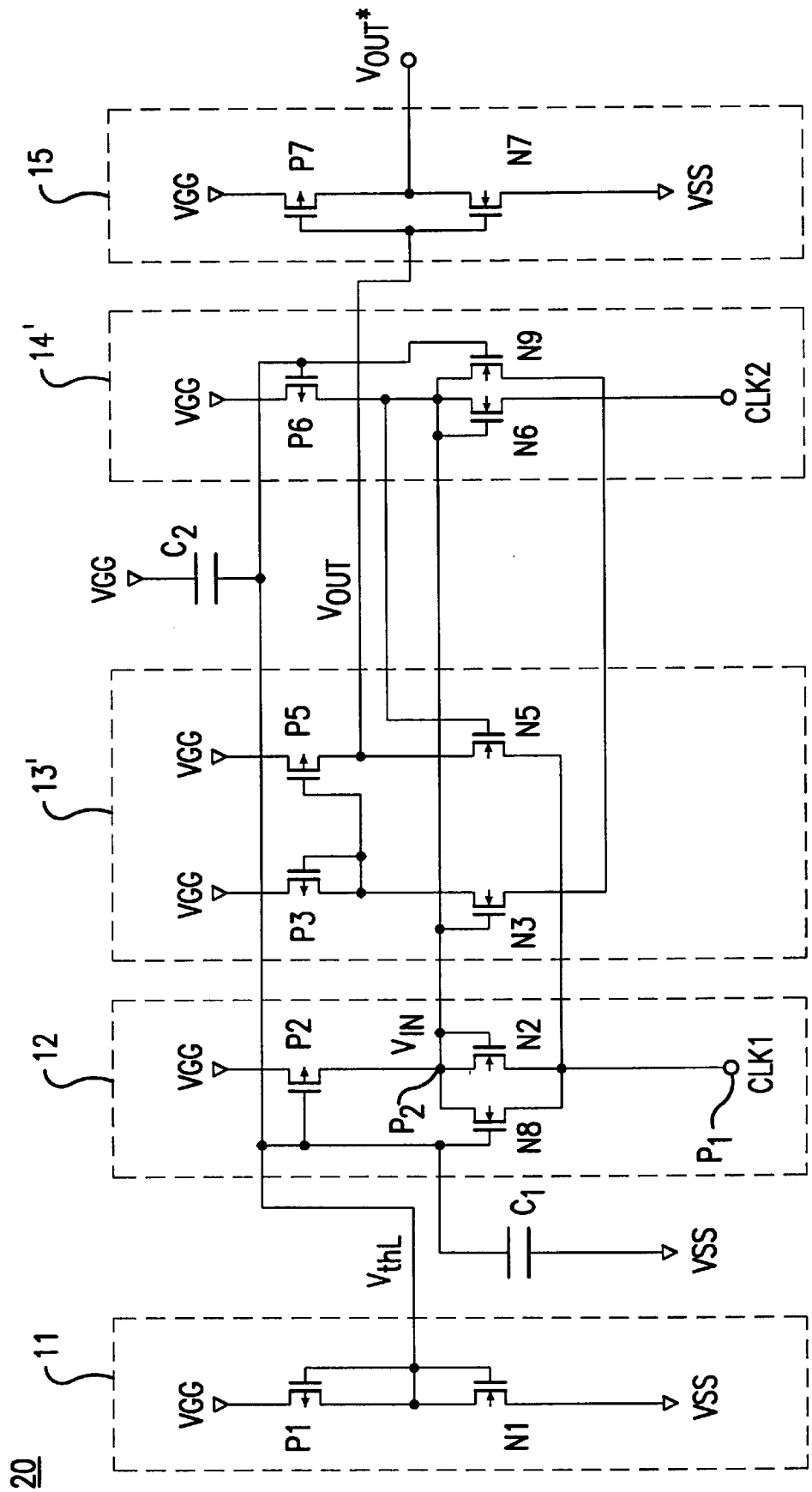
FIG. 6 is a schematic diagram showing the second embodiment of the logic amplitude level converter circuit in the present invention.

FIG. 6 is a schematic diagram showing a second embodiment of the logic amplitude level converter circuit of the present invention. In FIG. 6, components identical to those described with reference to FIG. 3 are designated with the same reference numerals and the description about them is omitted here.

The logic amplitude level converter circuit 20 is a two-phase input type, and a pulse amplifier circuit 13' and a load value variable control circuit 14' are different from those in the first embodiment.

The pulse amplifier circuit 13' is a current-mirror type pulse amplifier circuit which includes an input transistor N3 for variably controlling the current flowing through a current-source transistor P3 and a load transistor N5 for variably controlling the mirror current flowing through a mirror current transistor P5, and the output terminal $P_1$ is connected to the gate of the input transistor N3 while a low logic amplitude clock input signal CLK2 having opposite phase to a low logic amplitude input signal CLK1 is connected to the source of the input transistor N3.

The load value variable control circuit 14' offsets the voltage of the opposite phase input signal CLK2 to feed it to the gate of the load transistor N5 as a control signal. It comprises a mirror current transistor P6 which, along with the logic threshold value generator circuit 11, constitutes the current mirror circuit, and a diode-configured offset voltage generator transistor N6 connected in series with the mirror current transistor P6, with its source as an input terminal for the opposite phase input signal CLK 2 and with its drain as an output terminal for the control signal, and a DC bias setting transistor N9 for receiving the logic threshold voltage $V_{thL}$ at its gate like the DC bias setting transistor N8.

Since CLK2 becomes low level when CLK1 becomes high level, the offset voltage generated at the offset voltage generator transistor N6 drops, and the load transistor N5 becomes a high load, driving its drain voltage upward so that the high logic amplitude $V_{out}$ becomes high level. Conversely, since CLK2 becomes high level when CLK1 becomes low level, the offset voltage generated at the offset voltage generator transistor N6 rises, and the load transistor N5 becomes a low load, driving its drain voltage downward so that the high logic amplitude $V_{out}$ becomes low level.

Since the signal being amplified $V_{in}$, supplied to the pulse amplifier circuit 13', is designed to swing relative to the logic threshold voltage $V_{thL}$ of the output CMOS inverter 15 as a reference, the output signal $V_{out}$ of the pulse amplifier circuit 13' swings relative to the logic threshold voltage of the output inverter 15 as a reference. For this reason, the distortion of the duty factor of the high logic amplitude inverter output $V_{out}*$ is controlled to the duty factors of the low logic amplitude clock signals CLK1 and CLK2.

If the ratio of size (channel width/channel length) of transistors constituting the logic threshold value shift circuit 12 is set to be equal to the ratio of size (channel width/channel length) of transistors constituting the load value variable control circuit 14', its symmetry becomes good. More preferably, corresponding transistors are set to be identical to each other in size (for example, P2 to P6, N2 to N6, and N8 to N9). If the second embodiment also includes mutually equally sized N-channel transistors and mutually equally sized P-channel transistors, the entire circuit is well balanced.

The pulse amplifier circuit 13' is of a two-phase input, differential current mirror circuit type, and suited for the level shifting of a high-speed signal such as a clock signal.

(Third embodiment)

Figure 7:
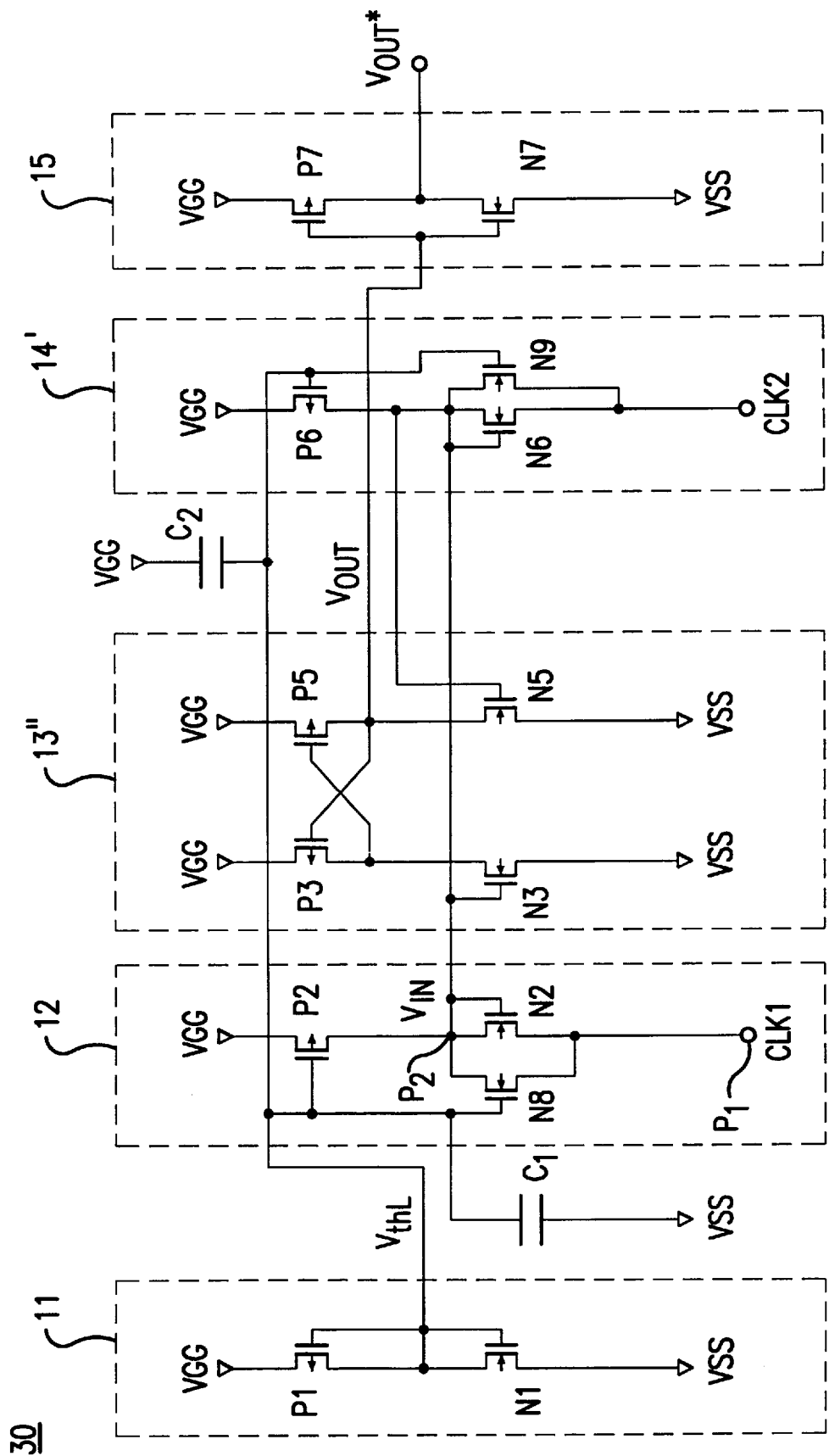
FIG. 7 is a schematic diagram showing the third embodiment of the logic amplitude level converter circuit in the present invention.

FIG. 7 is a schematic diagram showing a third embodiment of the logic amplitude level converter circuit of the present invention. In FIG. 7, components identical to those described with reference to FIG. 6 are designated with the same reference numerals, and the description about them is omitted here.

A logic amplitude level converter circuit 30 of this embodiment is of a two-phase input type, and a pulse amplifier circuit 13" is different from that in the second embodiment.

The pulse amplifier circuit 13" is a flip-flop type pulse amplifier circuit which includes the first transistor N3 for controlling one transistor P5 of a flip-flop to turn on and off, and the second transistor N5 for controlling the other transistor of the flip-flop to turn on and off. The output terminal $P_2$ is connected to the gate of the first transistor N3, and the drain voltage of the offset voltage generator transistor N6 of the load value variable control circuit 14' is coupled to the gate of the second transistor N5 as a control signal.

When the clock input signal CLK2 is at a low level, the clock input signal CLK1 becomes high level, and the first transistor N3 becomes a low load. Then, since the transistor P5 turns on and the offset voltage generated at the offset voltage generator transistor N6 drops, the second transistor N5 becomes a high load and the transistor P3 turns off. The high logic amplitude output $V_{out}$ is thus pulled up to the power supply voltage $V_{GG}$ to become high level.

In contrast, when the clock input signal CLK2 is at a high level the clock input signal CLK1 becomes low level, the first transistor N3 becomes a high load. Then, since the transistor P5 turns off and the offset voltage generated at the offset voltage generator transistor N6 drops, the second transistor N5 becomes a high load and the transistor P3 turns on. The high logic amplitude output $V_{out}$ is thus pulled down to the power supply voltage $V_{SS}$ to become low level.

Since the signal being amplified $V_{in}$, supplied to the pulse amplifier circuit 13", is designed to swing relative to the logic threshold voltage $V_{thL}$ of the output CMOS inverter 15 as a reference, the output signal $V_{out}$ of the pulse amplifier circuit 13" swings relative to the logic threshold voltage of the output inverter 15 as a reference. For this reason, the distortion of the duty factor of the high logic amplitude inverter output $V_{out}*$ is controlled against the duty factors of the low logic amplitude clock signals CLK1 and CLK2.

If the ratio of size (channel width/channel length) of transistors constituting the logic threshold value shift circuit 12 is set to be equal to the ratio of size (channel width/channel length) of transistors constituting the load value variable control circuit 14', its symmetry becomes good. More preferably, corresponding transistors are set to be identical to each other in size (for example, P2 to P6, N2 to N6, and N8 to N9). If the second embodiment also includes mutually equally sized N-channel transistors and mutually equally sized P-channel transistors in the third embodiment, the entire circuit is well balanced.

Since the pulse amplifier circuit 13" is of a two-phase input, flip-flop type, which can control a through current, power consumption can be reduced.

(Fourth embodiment)

Figure 8:
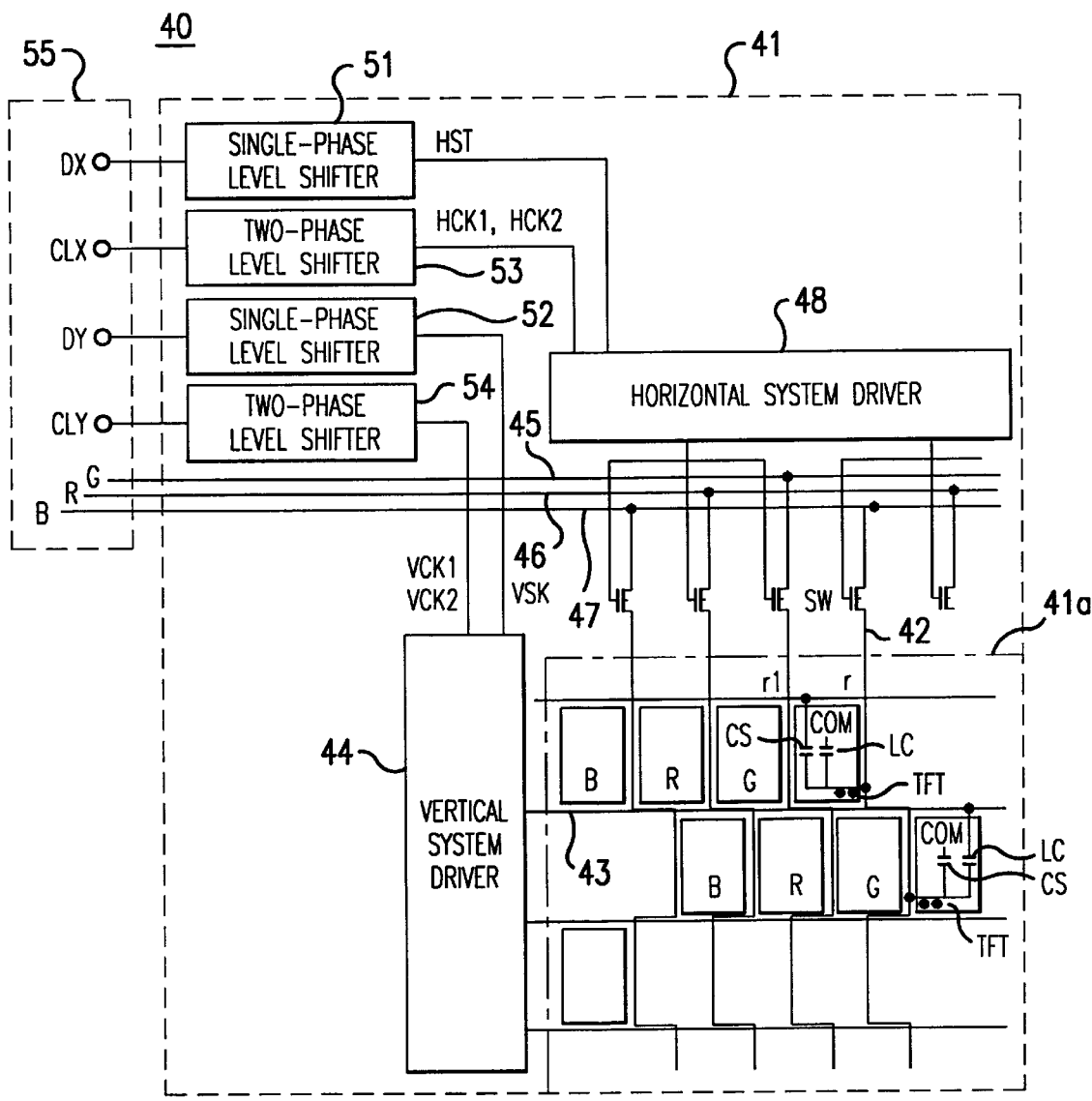
FIG. 8 is a plane view showing an active-matrix liquid-crystal device of the fourth embodiment of the present invention, in which the logic amplitude level converter circuit of the first, second or third embodiment is applied as a clock interface.

FIG. 8 is a plane view of an active-matrix liquid-crystal display apparatus in which the logic amplitude level converter circuit according to one of the embodiments 1, 2 and 3 is used as a clock interface.

A liquid-crystal panel 41 in the active-matrix liquid-crystal display apparatus 40 of this embodiment is constructed by interposing a liquid crystal LC between a pair of substrates. Formed on one substrate are an active-matrix pixel assembly 41a having a matrix of pixels, a vertical system driver 44, a horizontal system driver 48, and level shifters 51–54, and formed on the other (opposing) substrate are color filters R, G, and B, and an opposing electrode COM arranged on top of the color filters. The liquid-crystal panel 41 further includes a number of pixel liquid crystals LC arranged in a matrix and TFTs for driving them, respectively. A supplementary capacitor CS is connected in parallel to each liquid crystal LC. The drain of each TFT is connected to the pixel electrode for applying an image signal to the corresponding liquid crystal LC, the source of the TFT is connected to a signal line 42, and the gate of the TFT is connected to a gate line 43. The other terminal of each liquid crystal LC is electrically connected to the opposing electrode COM which faces the pixel electrode with the liquid crystal LC interposed therebetween.

A plurality of gate lines 43 are connected to the vertical system driver (vertical shift register) 44 and are supplied with a selection signal. The signal lines 42 with the same color filter are connected to the data lines 45, 46 and 47, respectively, via sampling switches SW, to receive an image signal. Each sampling switch SW is connected to a horizontal shift register via a corresponding gate circuit in the horizontal system driver 48. The vertical system driver 44, horizontal system driver 48 and the like constitute a surrounding drive circuit.

The vertical system driver 44 sequentially selects the gate lines 43 on a line-by-line basis. The horizontal system driver 48 causes a sampling switch SW to conduct, and distributes hue video signals to the corresponding signal lines 42. When one gate line 43 is selected, TFTs on that line become concurrently conductive, and the hue image signal sampled through each signal line 42 is written on the liquid crystal LC and the supplementary capacitor CS. When the gate line selection is disengaged, the video signal written on the liquid crystal LC and the supplementary capacitor CS is held until a next selection operation. The liquid-crystal panel 41 needs no color filters when it is used for a monochrome presentation or single color light modulation.

The horizontal system driver 48 is activated by a horizontal start signal HST, and sends the horizontal start signal HST sequentially in synchronization with horizontal clock signals HCK1 and HCK2 having opposite phase to each other, driving the sampling switches SW. The vertical system driver 44 is activated by a vertical start signal VST, and sends the vertical start signal VST sequentially in synchronization with vertical clock signals VCK1 and VCK2 having opposite phase to each other, selecting the plurality of gate lines 43 on a line-by-line basis. The horizontal start signal HST is internally generated by the single-phase level shifter 51 in the logic amplitude level converter circuit 10 described in the first embodiment, and the vertical start signal VST is also internally generated by the single-phase level shifter 52 in the logic amplitude level converter circuit 10. The horizontal clock signals HCK1 and HCK2 are internally generated by the two-phase level shifter 53 in the logic amplitude level converter circuit 20 (or 30) described in the second (or third) embodiment, and the vertical clock signals VCK1 and VCK 2 are also internally generated by the two-phase level shifter 54 in the logic amplitude level converter circuit 20 (or 30). The above level shifters 51–54 are supplied with the low logic amplitude clock signals from the external timing generator (TG) 55.

The power supply voltage of the liquid-crystal panel 41 is about 12 V. If the logic amplitude level converter circuit 10, 20 (or 30) is used as a clock interface, it would be difficult to distort the high logic amplitude clock signal subsequent to conversion with respect to the low logic amplitude clock signal generated by the external timing generator 55. Although light irradiation on the liquid-crystal panel 41 by the light source raises the temperature, the logic threshold voltages are kept constantly equal because the output inverter and the dummy inverter vary at a substantially equal rate.

The N-channel type is used as the input transistor of the pulse amplifier circuit in the above embodiments, but the P-channel type may be used and in this case, the polarities of the remaining transistors. Furthermore, modifying the polarities of transistors appropriately allows the low (narrow) logic amplitude signal of 0—−3 V to be converted into a high logic amplitude signal of 0—−12 V or a high (wide) logic amplitude signal of 0—+12 V.

In the above embodiments the TFTs formed on the insulating substrate (of glass, for example) have been described as circuit elements, but the one substrate may be constructed of a semiconductor substrate, and in such a case, the present invention can be applied by substituting the TFT for a field-effect transistor with its source, drain and channel formed in a surface of the semiconductor substrate.

[Fifth embodiment]

Figure 9:
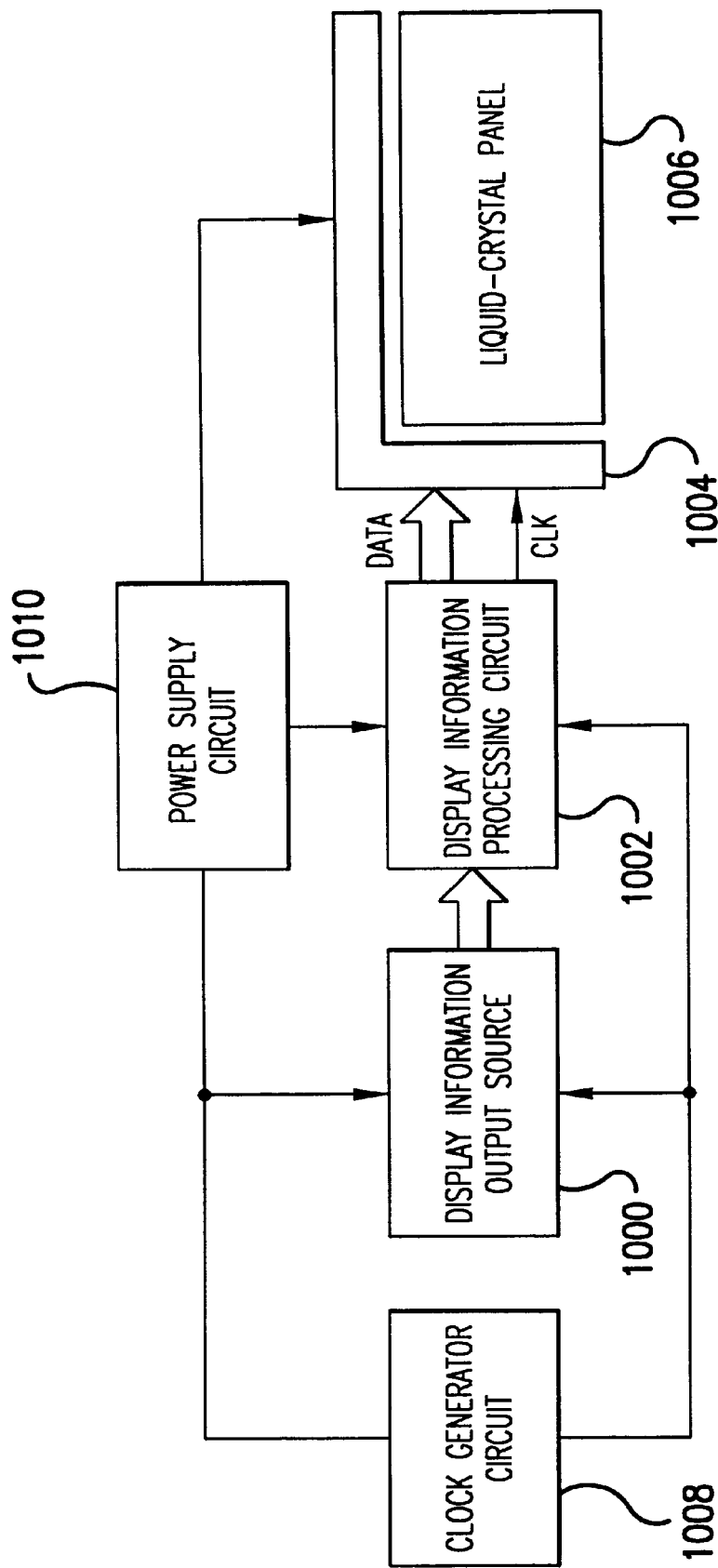
FIG. 9 is a block diagram of an electric apparatus which uses the liquid-crystal device in the fourth embodiment in the fifth embodiment of the present invention.

FIG. 9 is a block diagram showing an electronic apparatus that incorporates the liquid-crystal device of the fourth embodiment.

The electronic apparatus comprises a display information output source 1000, a display information processing circuit 1002, a display driving circuit 1004, a liquid-crystal panel 1006, a clock generator circuit 1008, and a power supply circuit 1010.

The display information output source 1000 includes memories such as ROM and RAM and a tuning circuit for tuning to a television signal, and outputs display information such as a video signal in response to a clock from the clock generator circuit 1008. The display information processing circuit 1002 processes and outputs the display information in response to the clock from the clock generator circuit 1008. The display information processing circuit 1002 can include, for example, an amplifier/polarity reversal circuit, a phase expansion circuit, a rotation circuit, a gamma circuit, a clamp circuit, and so on. The display driving circuit 1004 includes a horizontal driving circuit and a vertical driving circuit, and drives the liquid-crystal panel 1006 when image signal DATA and a clock signal CLK are supplied from the display information processing circuit 1002. The liquid-crystal panel 1006 and the display driving circuit 1004 incorporate the liquid-crystal device of the fourth embodiment. The power supply circuit 1010 supplies power to each of the above circuits.

Figure 10:
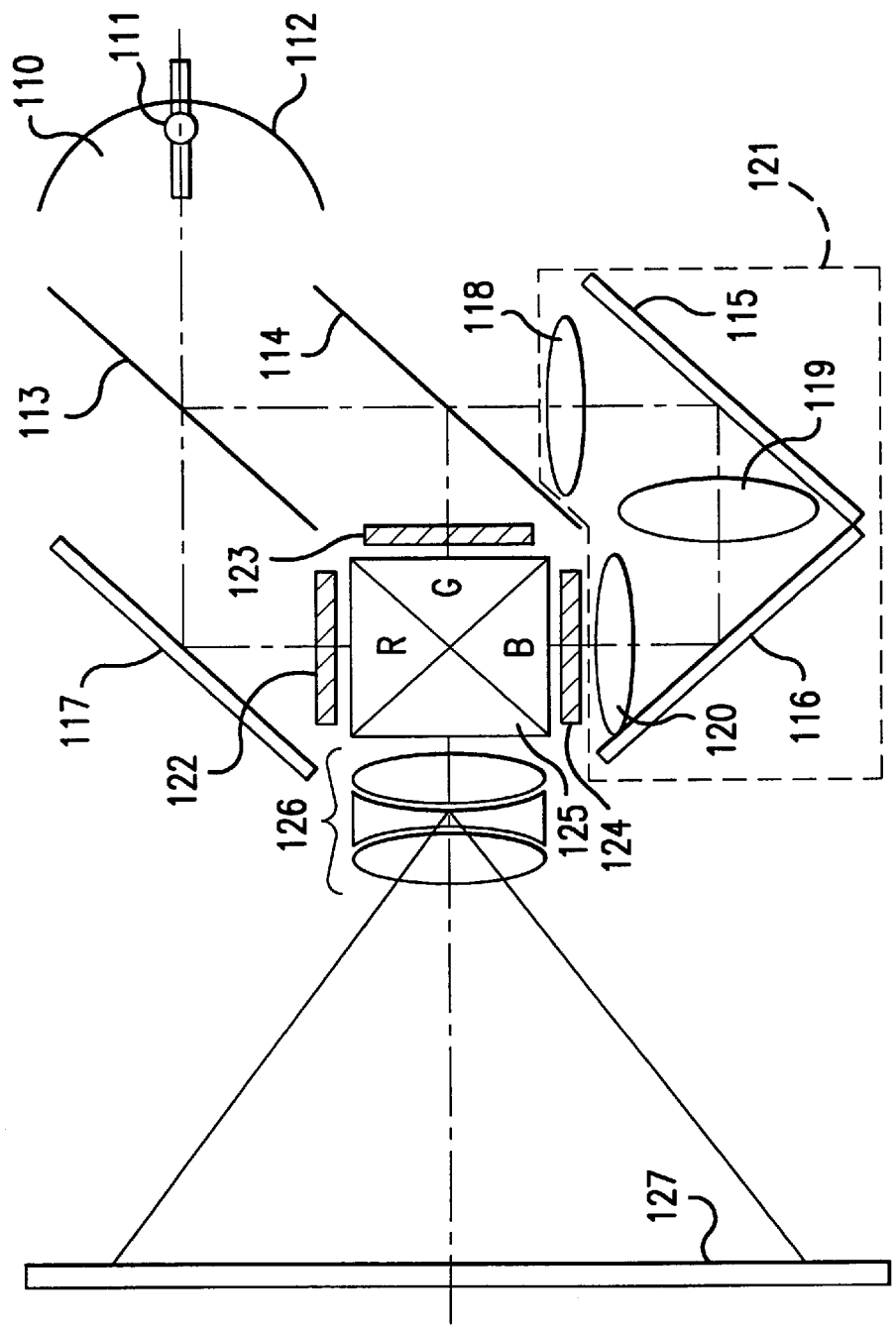
FIG. 10 is a diagram roughly showing a major portion of a projection-type display apparatus.
Figure 11:
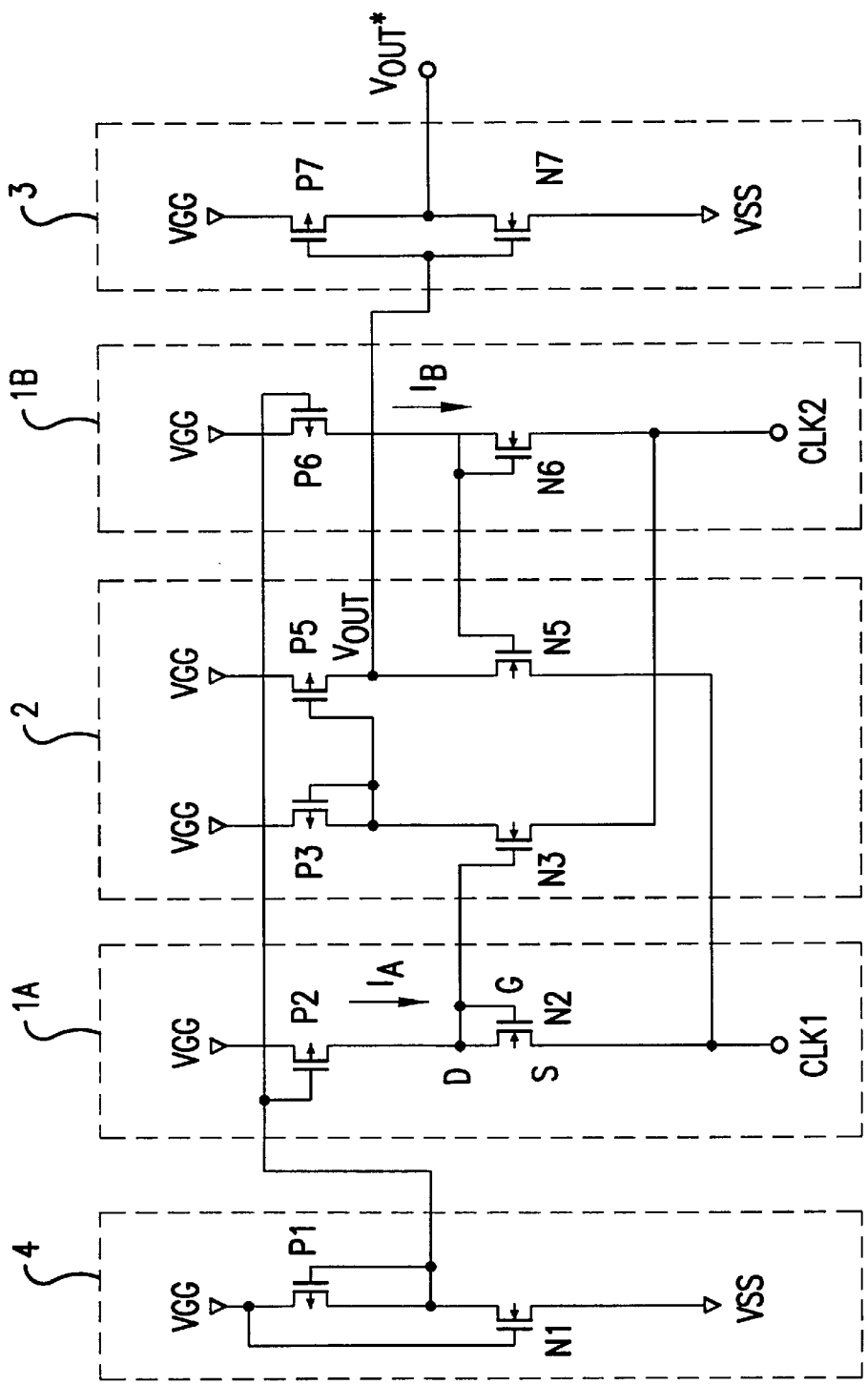
FIG. 11 is a schematic diagram showing a conventional logic amplitude level converter circuit.
Figure 12:
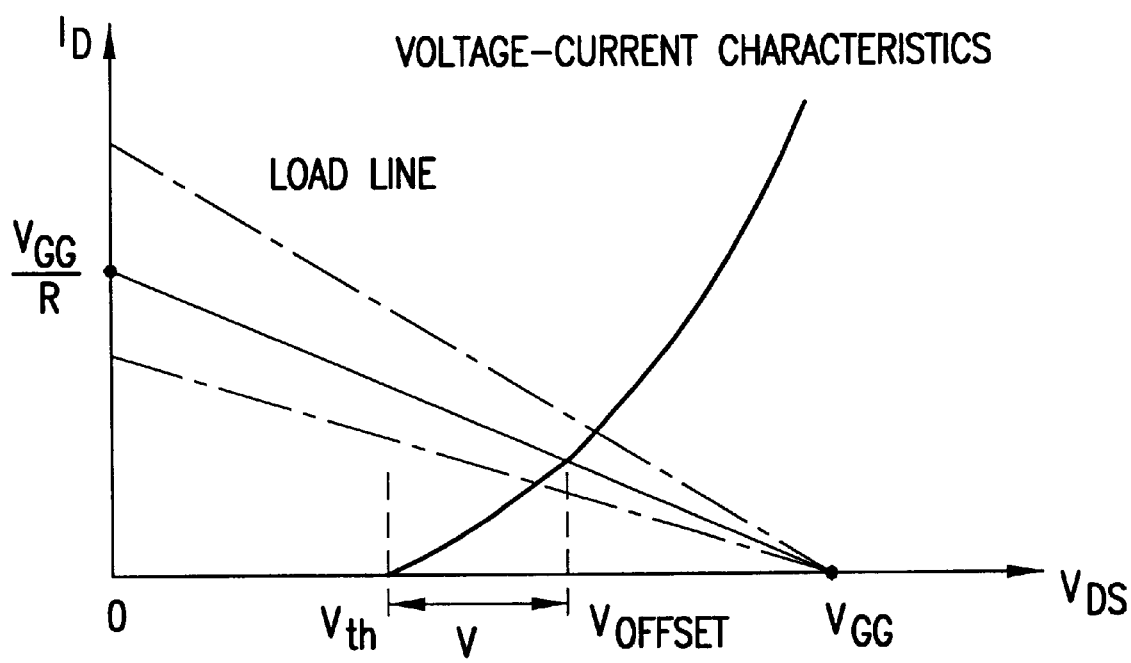
FIG. 12 is a graph showing the voltage-current characteristics of an offset voltage generator transistor in the logic amplitude level converter circuit of FIG. 11.

The electronic apparatuses thus constructed include a liquid-crystal display projector shown in FIG. 10, a multimedia personal computer (PC), an engineering workstation (EWS), a pager or portable telephone, a wordprocessor, a television receiver, a video camera with a viewfinder or a monitor, an electronic pocketbook, a tabletop calculator, a car navigation system, a POS terminal, and an electronic device with a touch panel.

FIG. 10 is a diagram roughly showing a major portion of the projection-type display apparatus. Shown here are a light source 110, a dichroic mirror 113, reflecting mirrors 115, 116 and 117, relay lenses 118, 119, and 120, liquid-crystal display light valves 122, 123, and 124, which incorporate the liquid-crystal device of the fourth embodiment, a cross-dichroic prism 125, a projection lens 126, and a screen 127.

The light source 110 includes a lamp 111 such as a metal halide lamp and a reflector 112 for reflecting the light from the lamp 111. The blue-light and green-light reflecting dichroic mirror 113 transmits red light in white light flux from the light source 110 while reflecting the blue light and green light. The red light transmitted is reflected by the reflecting mirror 117, and introduced into the red-light liquid-crystal light valve 122. The green light, out of the color lights reflected off the dichroic mirror 113 is reflected from the green-light reflecting dichroic mirror 114, and is introduced into the green-light liquid-crystal light valve 123. On the other hand, the blue light is transmitted through the second dichroic mirror 114. As for the blue light, entrance means 121 constructed of a relay lens system including an entrance lens 118, a relay lens 119, an exit lens 120 is provided to prevent the blue light from losing light because of its long light path, and blue light is introduced into the blue light liquid-crystal light valve 124 through the entrance means 121. The three color lights modulated by the light valves enter the cross-dichroic prism 125. This prism is constructed by gluing four right-angle prisms, and a dielectric multilayered film for reflecting the red light and a dielectric multilayered film for reflecting the blue light interposed in a cross configuration in the interfaces between the right-angle prisms. These multilayered films synthesize the three color lights to form the light for a color image. The projection lens 126 which is a projection optical system, projects the synthesized light onto the screen 127 to display the enlarged image on the screen 127.

[Advantages]

As described above, since the logic amplitude level converter circuit of the present invention includes the voltage biasing means which is placed ahead of the pulse amplifier circuit to obtain the signal being amplified swinging relative to the logic threshold voltage of the output-stage buffer circuit in response to the high-low level change of the input signal having a low logic amplitude, the following advantages result.

(1) Since the signal being amplified to the pulse amplifier circuit is designed to swing relative to the logic threshold voltage of the output-stage buffer circuit, the output signal of the pulse amplifier circuit swings relative to the logic threshold voltage of the output-stage buffer circuit. For this reason, the distortion of the duty factor of the high logic amplitude output-stage buffer circuit can be controlled against the duty factor of the low logic amplitude input signal. Therefore, the logic amplitude level converter circuit of the present invention is suited for a clock interface.

(2) The voltage biasing means comprises the logic threshold value generator circuit for generating the logic threshold voltage of the output-stage buffer circuit, and the logic threshold value shift circuit for obtaining the signal being amplified by adjusting an offset voltage in response to the high-low level change of the low logic amplitude input signal with the generated logic threshold voltage as a DC bias. In this arrangement, since the offset voltage is adjusted and output referring to the level of the DC bias as an established reference, and the output signal (the signal being amplified) of the logic threshold value shift circuit is therefore interpreted as a logic threshold value shift signal in which the logic threshold value (approximately the center of the amplitude) of the low logic amplitude is shifted to a logic threshold value of the high logic amplitude, and thus the logic threshold value can be adjusted with certainty, controlling the distortion of the duty factor.

(3) The logic threshold value shift circuit comprises the mirror current transistor which, along with the logic threshold value generator circuit, constitutes the current mirror circuit, the diode-configured offset voltage generator transistor, connected in series with the mirror current transistor, with its source as an input terminal for the low logic amplitude input signal and with its drain as an output terminal, and the DC bias setting means connected in parallel with the offset voltage generator transistor. In this arrangement, the signal being amplified can be produced with certainty, which swings the logic threshold voltage of the output inverter. A low-resistance element as the DC bias setting means is advantageously easy to manufacture at the semiconductor process.

(4) The use of the voltage holding means for holding the logic threshold voltage helps to reduce the effect of noise and control fluctuations in the logic threshold voltage.

(5) Available as the voltage holding means is a capacitor formed between the output wiring layer of the logic threshold value generator circuit and a power supply wiring layer. The capacitor can be an interlayer capacitor that contains a region which a wide wiring line of the output wiring layer and the power supply wiring layer are overlapped and run in parallel, with an interlayer insulating film between. Since the capacitor can be made by only modifying the shape and routing of the wiring layer without extra process steps, it is advantageous at manufacturing process.

(6) The distortion of the high-speed clock is controlled when the logic amplitude level converter circuit of the present invention is used for the clock interface of the liquid-crystal device. Although light irradiation on the liquid-crystal device by the light source raises the temperature, the logic threshold voltages are always kept equal because the output-stage buffer circuit and the logic threshold value generator vary at a substantially equal rate.

[Industrial Applicability]

The logic amplitude level converter circuit in the present invention which converts an input signal having a low (narrow) logic amplitude of 0–3 V to an output signal having a high (wide) logic amplitude of 0–12 V can be applied not only in a liquid-crystal device but also in other semiconductor devices.

What is claimed is:

1. A logic amplitude level converter circuit comprising:
   voltage biasing means obtaining a signal being amplified, the signal swinging relative to a logic threshold voltage of an output-stage buffer circuit as a reference, in response to a high-low level change of a low logic amplitude input signal; and
   a pulse amplifier circuit obtaining a high logic amplitude signal by pulse-amplifying the signal being amplified;
   the output-stage buffer circuit obtaining an inverted signal in response to the high logic amplitude signal as an input.

2. The logic amplitude level converter circuit according to claim 1, wherein the voltage biasing means comprises:
   a logic threshold value generator circuit generating the logic threshold voltage of the output-stage buffer circuit; and
   a logic threshold value shift circuit for obtaining the signal being amplified that, with the generated logic threshold voltage as a DC bias, adjusts an offset voltage to the DC bias in response to the high-low level change of the low logic amplitude input signal.

3. The logic amplitude level converter circuit according to claim 2, wherein the logic threshold value generator circuit is constructed by connecting in a diode configuration a dummy inverter of complementary transistors that are manufactured in a structure substantially identical to a structure of the output-stage buffer circuit.

4. The logic amplitude level converter circuit according to claim 2, wherein the logic threshold value shift circuit comprises:
   a mirror current transistor that, along with the logic threshold value generator circuit, constitutes a current mirror circuit;
   a diode-configured offset voltage generator transistor connected in series with the mirror current transistor, with a source of the offset voltage generator transistor as an input terminal for the low logic amplitude input signal and with a drain of the offset voltage generator transistor as an output terminal; and
   DC bias setting means connected in parallel with the offset voltage generator transistor.

5. The logic amplitude level converter circuit according to claim 4, wherein the DC bias setting means is a resistance element.

6. The logic amplitude level converter circuit according to claim 4, wherein the DC bias setting means is a ON-resistance of a transistor.

7. The logic amplitude level converter circuit according to claim 2, further comprising voltage holding means for holding the logic threshold voltage.

8. The logic amplitude level converter circuit according to claim 7, wherein the voltage holding means is a capacitor formed between an output wiring layer of the logic threshold value generator circuit and a power supply wiring layer.

9. The logic amplitude level converter circuit according to claim 8, wherein the capacitor is an interlayer capacitor that includes an overlap region where a wide wiring line of the output wiring layer and the power supply wiring layer run in parallel with an interlayer insulating film interposed therebetween.

10. The logic amplitude level converter circuit according to claim 4, wherein the pulse amplifier circuit is a current-mirror type pulse amplifier circuit that comprises:
    an input transistor for variably controlling current flowing through a current-source transistor; and
    a load transistor for variably controlling mirror current flowing through a mirror current transistor;
    the output terminal being connected to a gate of the input transistor while the input terminal is connected to a source of the load transistor; and
    the pulse amplifier circuit comprising a load value variable control circuit that inverts the high-low level of the voltage at the output terminal and feeds the inverted signal to a gate of the load transistor as a control signal.

11. The logic amplitude level converter circuit according to claim 10, wherein the load value variable control circuit comprises:
    a mirror current transistor that, along with the logic threshold value generator circuit, constitutes a current mirror circuit; and
    a drive transistor connected in series with the mirror current transistor, with a voltage at the output terminal as a gate voltage and with a drain voltage as the control signal.

12. The logic amplitude level converter circuit according to claim 4, wherein the pulse amplifier circuit is a current-mirror type pulse amplifier circuit that comprises:
    an input transistor for variably controlling current flowing through a current-source transistor; and a load transistor for variably controlling mirror current flowing through a mirror current transistor;

the output terminal being connected to a gate of the input transistor while a low logic amplitude input signal of opposite phase to a first input signal is coupled to a source of the input transistor; and the pulse amplifier circuit comprising a load value variable control circuit that offsets a voltage of the opposite phase input signal and applies the offset voltage to a gate of the load transistor as a control signal.

13. The logic amplitude level converter circuit according to claim 4, wherein the pulse amplifier circuit is a flip-flop type pulse amplifier circuit that comprises:

a first transistor for controlling a switch of one transistor of a flip-flop to turn and off the one transistor; and a second transistor for controlling another transistor of the flip-flop to turn on and off the another transistor, with the output terminal connected to a gate of the first transistor; and the pulse amplifier circuit comprising a load value variable control circuit that offsets a voltage of the opposite phase input signal and applies the offset voltage to a gate of the second transistor as a control signal.

14. The logic amplitude level converter circuit according to claim 12, wherein the load value variable control circuit comprises:

a mirror current transistor that, along with the logic threshold value generator circuit, constitutes a current mirror circuit;

a diode-configured offset voltage generator transistor connected in series with the mirror current transistor, with a source of the offset voltage generator transistor as an input terminal for the opposite phase input signal and with a drain of the offset voltage generator transistor as an output terminal for the control signal; and a DC bias setting transistor connected in parallel with the offset voltage generator transistor.

15. A liquid-crystal device comprising:

a liquid crystal interposed between a pair of substrates;

a pixel assembly arranged in a matrix of transistors with pixel electrodes respectively connected to the transistors on one of the substrates;

a drive circuit arranged on one of the substrates for controlling the supply of a signal to the pixel assembly; and a clock interface arranged on one of the substrates that supplies the drive circuit with a clock signal, the clock interface comprising the logic amplitude level converter circuit according to claim 1.

16. An electronic apparatus comprising the liquid-crystal device according to claim 15.

17. A logic amplitude level converter circuit including a voltage level converter circuit which converts an input signal of a relatively low logic amplitude into an output signal having a relatively high logic amplitude, and an output circuit for inverting the output signal from the voltage level converter circuit, the voltage level converter circuit comprising:

a logic threshold value shift circuit that receives the input signal and generates a signal being converted, for causing the input signal to swing respect to a logic threshold voltage of the output circuit as a reference; and an amplifier circuit for amplifying the signal being converted.

18. The logic amplitude level converter circuit according to claim 17, further comprising a logic threshold value generator circuit for generating the logic threshold voltage of the inverter circuit, and a circuit current value being controlled according to the logic threshold voltage in the logic threshold value shift circuit.

19. A logic amplitude level converter circuit including a voltage level converter converting an input signal having a relatively low logic amplitude into an output signal having a relatively high logic amplitude, and an output circuit for inverting the output signal from the voltage level converter, the voltage level converter comprising:

an input terminal for the input signal;

a first transistor which inputs a logic threshold voltage of the output circuit to its gate;

electrically parallel-connected second and third transistors that are electrically connected in series between the input terminal and the first transistor, a gate of the second transistor inputting the logic threshold voltage;

an electrical node of the first transistor and the second transistor, a gate of the third transistor being connected to the electrical node; and an amplifier for converting an output from the electrical node into an output signal having the relatively high logic amplitude.

20. A logic amplitude level converter circuit according to claim 19, wherein a capacitor formed relative to a potential of a power supply is attached to the gates of the first and second transistors.

21. The logic amplitude level converter circuit according to claim 1, logic threshold voltages of CMOS circuits in the pulse amplifier circuit coinciding with the logic threshold voltage of the output-stage buffer circuit.

22. The logic amplitude level converter circuit according to claim 17, logic threshold voltages of CMOS circuits in the amplifier circuit coinciding with the logic threshold voltage of the output circuit.

23. The logic amplitude level converter circuit according to claim 19, logic threshold voltages of CMOS circuits in the amplifier coinciding with the logic threshold voltage of the output circuit.

* * * * *